US009238364B2

United States Patent
Kondo

(10) Patent No.: US 9,238,364 B2
(45) Date of Patent: Jan. 19, 2016

(54) LIQUID JETTING APPARATUS AND PIEZOELECTRIC ACTUATOR

(71) Applicant: Hirofumi Kondo, Aichi-ken (JP)

(72) Inventor: Hirofumi Kondo, Aichi-ken (JP)

(73) Assignee: Brother Kogyo Kabushiki Kaisha, Aich-ken (JP)

( * ) Notice: Subject to any disclaimer, the term of this patent is extended or adjusted under 35 U.S.C. 154(b) by 0 days.

(21) Appl. No.: 14/076,331

(22) Filed: Nov. 11, 2013

(65) Prior Publication Data

US 2014/0132677 A1  May 15, 2014

(30) Foreign Application Priority Data

Nov. 12, 2012  (JP) ................................ 2012-248073

(51) Int. Cl.
| | |
|---|---|
| *B41J 2/14* | (2006.01) |
| *B41J 2/16* | (2006.01) |
| *H01L 41/047* | (2006.01) |
| *H01L 41/09* | (2006.01) |

(52) U.S. Cl.
CPC .......... *B41J 2/14201* (2013.01); *B41J 2/14233* (2013.01); *H01L 41/0475* (2013.01); *B41J 2002/14491* (2013.01); *H01L 41/0973* (2013.01)

(58) Field of Classification Search
CPC .. B41J 2/14201; B41J 2/14233; B41J 2/1623; B41J 2002/14491
USPC .......................................................... 347/68
See application file for complete search history.

(56) References Cited

U.S. PATENT DOCUMENTS

| | | | | |
|---|---|---|---|---|
| 2003/0081080 | A1* | 5/2003 | Moriya et al. | ................... 347/68 |
| 2003/0085961 | A1* | 5/2003 | Furuhata | .............. B41J 2/14233 347/68 |
| 2004/0246312 | A1* | 12/2004 | Moriya et al. | ................... 347/68 |
| 2005/0162481 | A1 | 7/2005 | Furuhata | |
| 2005/0275694 | A1 | 12/2005 | Murata et al. | |
| 2006/0232640 | A1* | 10/2006 | Ota | ...................... B41J 2/14233 347/68 |
| 2006/0290748 | A1* | 12/2006 | Shimada | .............. B41J 2/14233 347/68 |
| 2010/0134564 | A1* | 6/2010 | Miyata | ............................ 347/50 |
| 2012/0069095 | A1* | 3/2012 | Kida et al. | ....................... 347/54 |

FOREIGN PATENT DOCUMENTS

| | | |
|---|---|---|
| JP | 2006044222 | 2/2006 |
| JP | 2006240312 | 9/2006 |
| JP | 2010017901 | 1/2010 |
| JP | 2010228249 | 10/2010 |
| JP | 2011181646 | 9/2011 |

* cited by examiner

*Primary Examiner* — Matthew Luu
*Assistant Examiner* — Patrick King
(74) *Attorney, Agent, or Firm* — Frommer Lawrence & Haug LLP

(57) ABSTRACT

There is provided a liquid jetting apparatus, including: a channel structure in which a liquid channel including a nozzle and a pressure chamber communicating with the nozzle is formed; a piezoelectric element including a piezoelectric body and an electrode; a driving device; and a cover member joined to the surface of the channel structure. A first wiring section connected to the electrode is formed on the surface of the channel structure, and the cover member includes a cover body section and a wiring connection section. A second wiring section is formed in the cover member. The wiring connection section is joined to the surface of the channel structure in a state that the second wiring section is electrically conductive with the first wiring section. A thickness of the wiring connection section is thinner than a thickness of the cover body section.

14 Claims, 13 Drawing Sheets

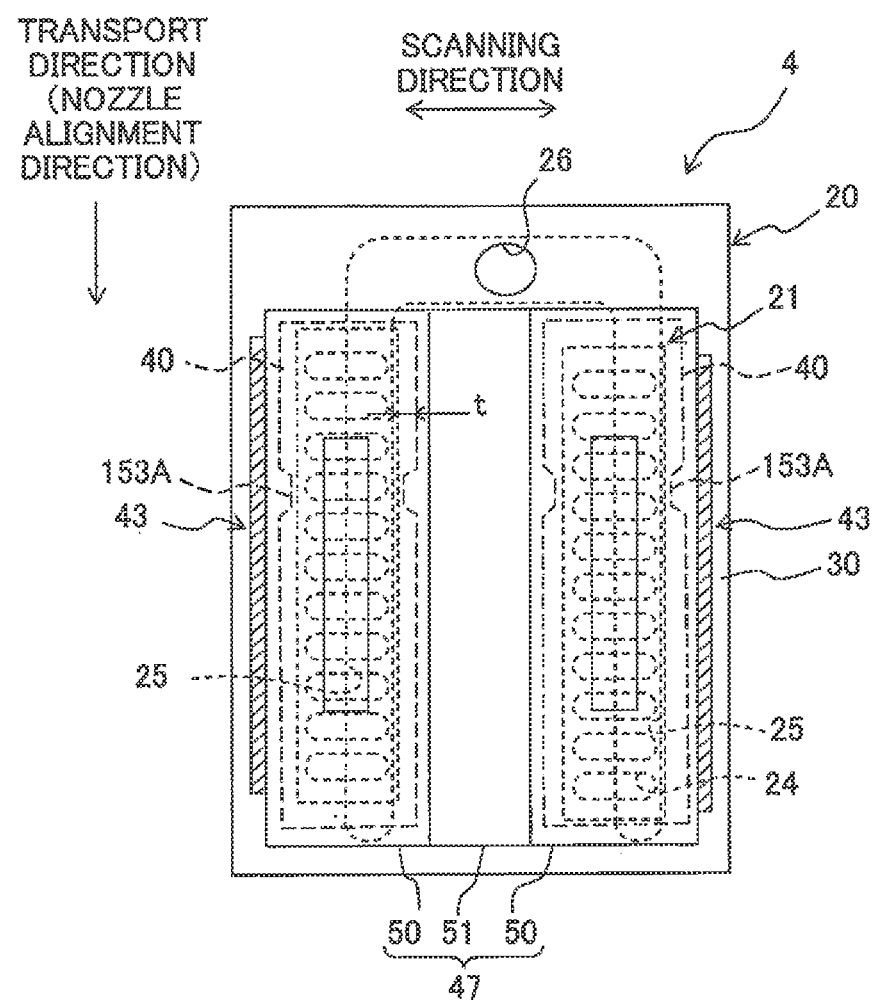

LIQUID JETTING APPARATUS AND PIEZOELECTRIC ACTUATOR

CROSS REFERENCE TO RELATED APPLICATION

The present application claims priority from Japanese Patent Application No. 2012-248073, filed on Nov. 12, 2012, the disclosure of which is incorporated herein by reference in its entirety.

BACKGROUND OF THE INVENTION

1. Field of the Invention

The present invention relates to a liquid jetting apparatus and a piezoelectric actuator.

2. Description of the Related Art

There has been conventionally known a liquid jetting apparatus having a piezoelectric actuator which applies jetting energy to a liquid. For example, there has been known an ink-jet head including a channel forming substrate in which a plurality of pressure chambers, which are communicated with a plurality of nozzles respectively, are formed and a piezoelectric actuator provided in the channel forming substrate.

One piezoelectric actuator includes a plurality of piezoelectric elements, which are arranged on the surface of an elastic film covering the pressure chambers formed in the channel forming substrate so as to face the pressure chambers, respectively. Further, a seal substrate is provided in the channel forming substrate to cover the piezoelectric elements and the piezoelectric elements are hermetically sealed by the seal substrate.

In the channel forming substrate, there are formed a plurality of lead electrodes which are drawn from the piezoelectric elements to the outer side of the seal substrate, respectively. Further, a driver IC for driving the piezoelectric elements is installed on the seal substrate. The lead electrodes are connected to the driver IC by wires individually (wire bonding).

In the above ink-jet head, the driver IC installed on the seal substrate covering the piezoelectric elements is connected to the lead electrodes drawn from the piezoelectric elements by the wire bonding. However, the connection by the wire bonding is actually troublesome. Especially, in a case that the lead electrodes, which are drawn from many piezoelectric elements respectively, are disposed densely in association with the high density arrangement of the nozzles of the ink-jet head, it is not easy to connect the wires to the lead electrodes one by one and the reliability of conduction declines eventually.

SUMMARY OF THE INVENTION

An object of the present teaching is to provide a piezoelectric actuator having a structure in which piezoelectric elements are hermetically sealed and electrical connection between each piezoelectric element and a driving device driving each piezoelectric element can be performed easily and reliably.

According to an aspect of the present teaching, there is provided a liquid jetting apparatus configured to discharge a liquid, including:

a channel structure in which a liquid channel including a nozzle and a pressure chamber communicating with the nozzle is formed;

a piezoelectric element including a piezoelectric body and an electrode, the piezoelectric body being arranged, on a surface of the channel structure, to face the pressure chamber, and the electrode being provided in the piezoelectric body;

a driving device electrically connected to the electrode to drive the piezoelectric element; and a cover member joined to the surface of the channel structure so that the cover member is stacked on the surface to cover the piezoelectric element, wherein a first wiring section connected to the electrode is formed on the surface of the channel structure;

the cover member includes a cover body section covering the piezoelectric element and a wiring connection section extending from the cover body section along the surface of the channel structure while facing at least a part of the first wiring section;

a second wiring section is formed in the cover member, the second wiring section being connected to the driving device and extending from the cover body section to a surface, of the wiring connection section, facing the first wiring section;

the wiring connection section is joined to the surface of the channel structure in a state that the second wiring section is electrically conductive with the first wiring section; and a thickness, of the wiring connection section, in a direction of stacking of the channel structure and the cover member is thinner than a thickness, of the cover body section, in the direction of stacking of the channel structure and the cover member.

In the present teaching, the piezoelectric element is hermetically sealed by being covered with the cover body section of the cover member. With this, it is prevented that outside wet (moisture) enters the piezoelectric element to cause a shirt circuit and migration and that dust adheres to the piezoelectric element. Further, the cover member also functions as a reinforcing member for reinforcing the piezoelectric element. However, the electrode of the piezoelectric element is required to be electrically connected to the driving device disposed on the outside of the cover member. In the present teaching, the first wiring section connected to the electrode of the piezoelectric element is arranged on the surface of the channel structure in which the piezoelectric element is arranged, and the second wiring section connected to the driving device is formed in the cover member covering the piezoelectric element. Further, the cover member includes the wiring connection section which extends along the surface of the channel structure and the second wiring section extends to the surface, of the wiring connection section, facing the first wiring section. Then, in a case that the cover member is joined to the channel structure, the wiring connection section is joined to the surface of the channel structure by being pressed thereto, and the second wiring section on the side of the wiring connection section is electrically conductive with the first wiring section on the side of the channel structure. Accordingly, the cover member in which the second wiring section is formed is joined to the surface of the channel structure, and thereby making it possible to perform the electrical connection between the piezoelectric element and the driving device easily.

The cover body section of the cover member preferably has a thickness of not less than a certain thickness for suppressing permeation of outside wet (moisture). Meanwhile, it is preferable that the wiring connection section is formed thinly to be deformable depending on the surface shape of the channel structure at the time of the joining in order to improve conductive reliability between the first wiring section and the second wiring section. In view of this, the wiring connection section is formed to have a thickness thinner than that of the cover body section in the present teaching. Accordingly, the first wiring section can be electrically conductive with the second wiring section reliably.

According to the present teaching, by joining the cover member in which the second wiring section is formed to the surface of the channel structure, the piezoelectric element can be electrically connected to the driving device easily. Further, the wiring connection section of the cover member joined to the surface of the channel structure is formed to have a thickness thinner than that of the cover body section covering the piezoelectric element. Since the cover member has a thickness of not less than a certain thickness, permeation of outside wet (moisture) is suppressed. Meanwhile, since the wiring connection section is formed thinly, when the wiring connection section is joined to the surface of the channel structure, the wiring connection section can be deformed depending on the surface profile of the channel structure and the conductive reliability between the first wiring section and the second wiring section is improved.

BRIEF DESCRIPTION OF THE DRAWINGS

FIG. 12 is a plan view of an ink-jet head including a high heat-resistance portion 153A.

DESCRIPTION OF THE PREFERRED EMBODIMENTS

Figure 1:
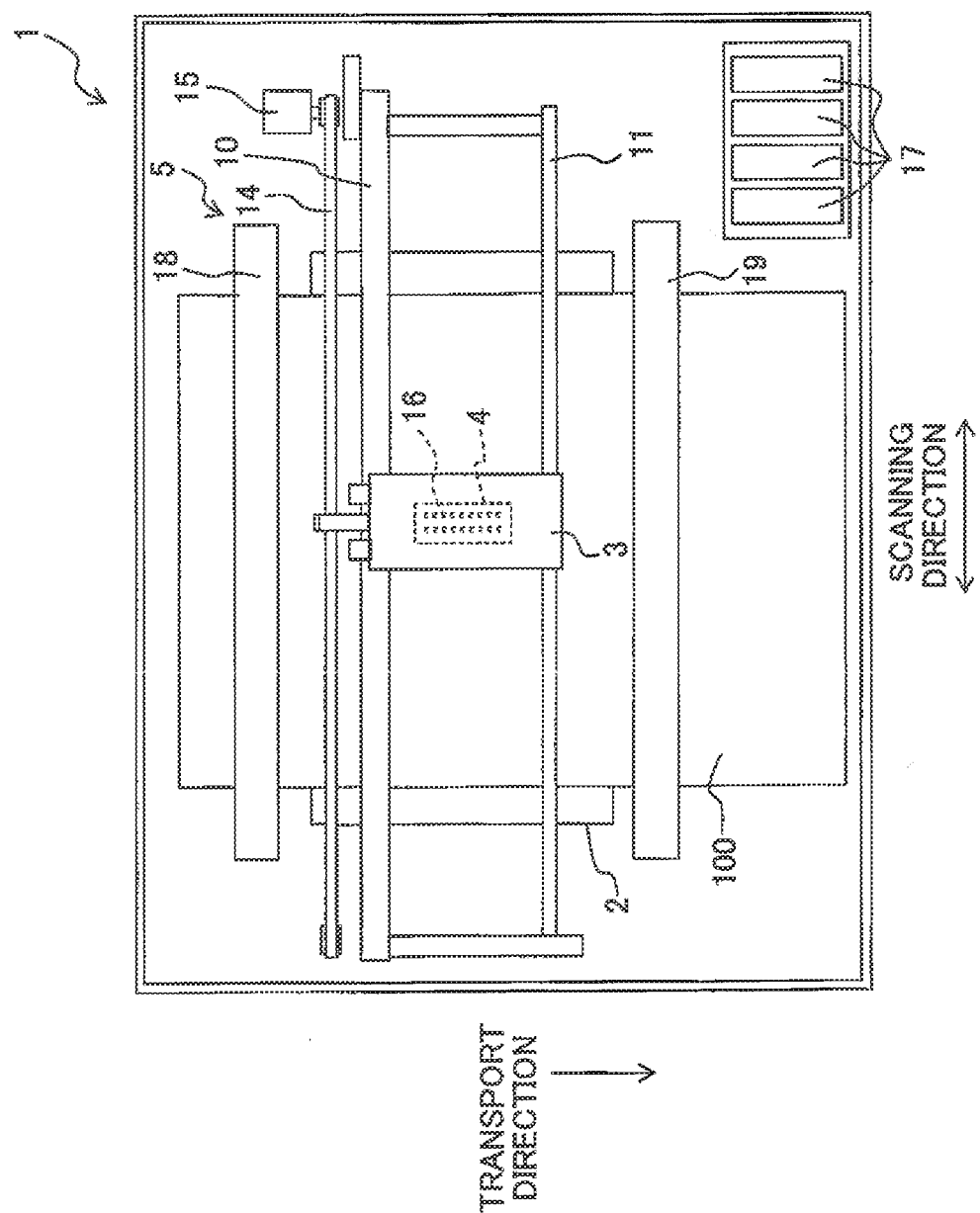
FIG. 1 is a schematic plan view of an ink-jet printer according to an embodiment of the present teaching.

Next, an embodiment of the present teaching will be explained. Referring to FIG. 1, a schematic construction of an ink-jet printer 1 will be explained. Further, in the following explanation, the front side of the page of FIG. 1 is defined to be the upper side while the back side of the page is defined to be the lower side, and the explanation will be made by using the directional terms "upper" and "lower" as appropriate. As shown in FIG. 1, the ink jet printer 1 includes a platen 2, a carriage 3, an ink-jet head 4, a transport mechanism 5, etc.

A recording paper sheet 100, which is a recording medium, is placed on the upper surface of the platen 2. The carriage 3 is configured to be movable reciprocatingly in a scanning direction along two guide rails 10 and 11 in an area facing the platen 2. The carriage 3 is connected to an endless belt 14, and the endless belt 14 is driven by a carriage driving motor 15 to move the carriage 3 in the scanning direction.

The ink-jet head 4 (a liquid jetting apparatus) is installed on the carriage 3, and moves along with the carriage 3 in the scanning direction. The ink-jet head 4 is connected to ink cartridges 17 installed on the printer 1 via unillustrated tubes. A plurality of nozzles 16 are formed on the lower surface of the ink-jet head 4 (the surface on the back side of the page of FIG. 1). The ink-jet head 4 jets the inks supplied from the ink cartridges 17 to the recording paper sheet 100 placed on the platen 2 from the plurality of nozzles 16.

The transport mechanism 5 has two transport rollers 18 and 19 arranged to interpose the platen 2 in a transport direction. The transport mechanism 5 transports the recording paper sheet 100 placed on the platen 2 in the transport direction by the two transport rollers 18 and 19.

The ink jet printer 1 allows the inks to be jetted from the ink-jet head 4, which moves reciprocatingly along with the carriage 3 in the scanning direction, to the recording paper sheet 100 placed on the platen 2. At the same time, the two transport rollers 18 and 19 transport the recording paper sheet 100 in the transport direction. By the above operation, images, characters and the like are recorded on the recording paper sheet 100.

Next, an explanation will be made about the ink-jet head 4. In FIG. 3, a cover member 47 is depicted by two-dot lines so that an arrangement relation between the ink-jet head 4 and the cover member 47 can be easily understood. In FIG. 4, the ink filled in each ink channel is indicated by the symbol "I". As shown in FIGS. 2 to 6, the ink-jet head 4 includes a channel unit 20 (channel structure), a piezoelectric actuator 21, a driver IC 46 (driving device), the cover member 47, and the like.

As shown in FIG. 4, the channel unit 20 has a structure in which five plates 30 to 34 having channel formation holes respectively are stacked. By allowing the channel formation holes to be communicated with each other at the time of stacking the five plates 30 to 34, each ink channel as described below is formed in the channel unit 20. The materials of the five plates 30 to 34 are not especially limited, and it is possible to adopt, for example, metallic plates such as stainless steel and nickel alloy steel.

Figure 2:
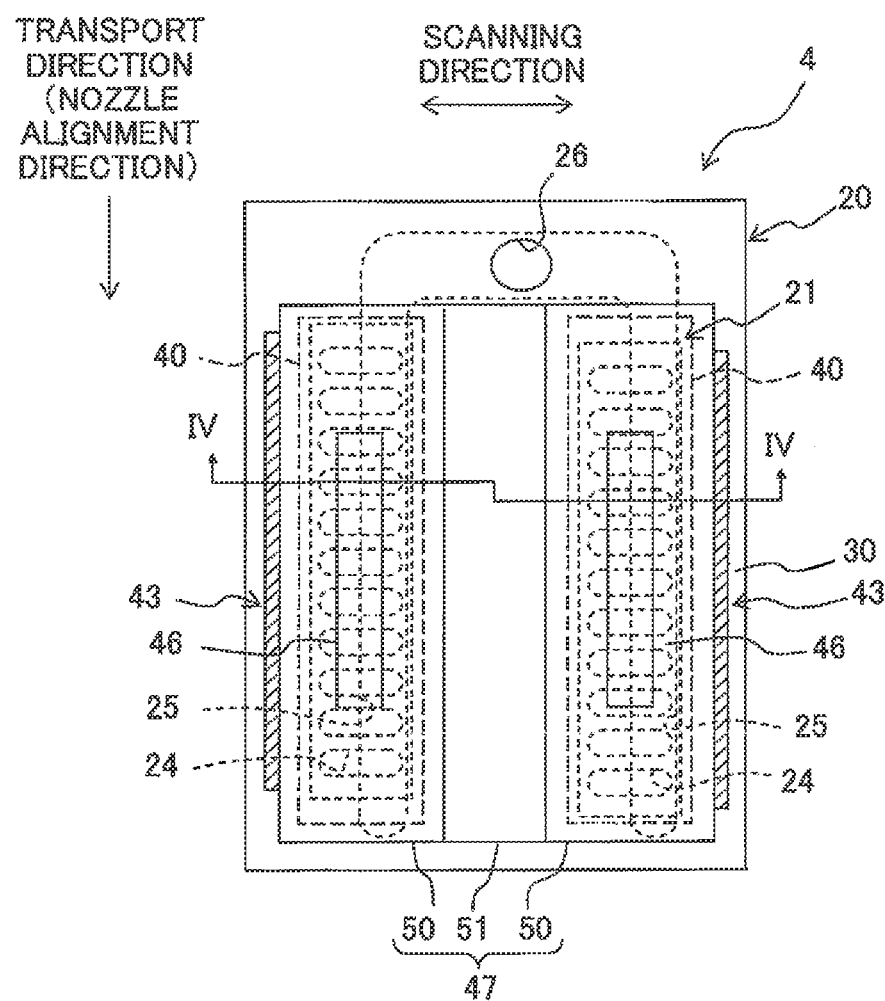
FIG. 2 is a plan view of an ink-jet head.
Figure 3:
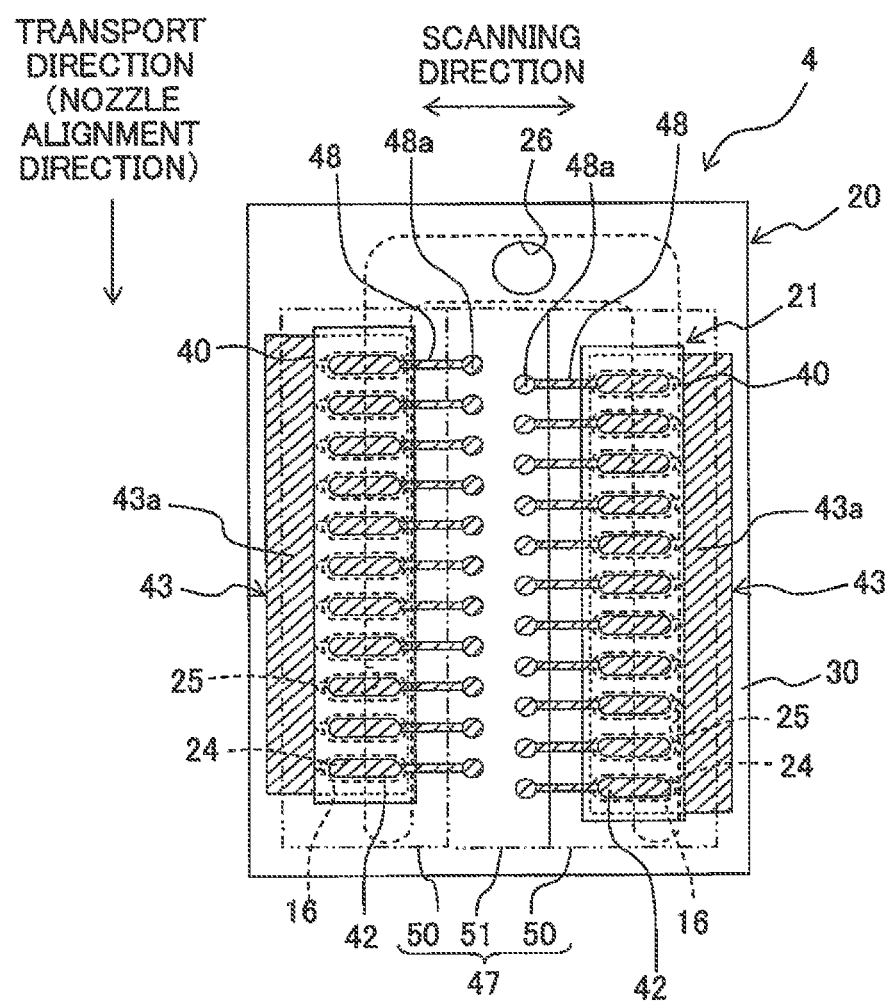
FIG. 3 is a plan view of the ink-jet head in a state that a cover member is not installed.
Figure 4:
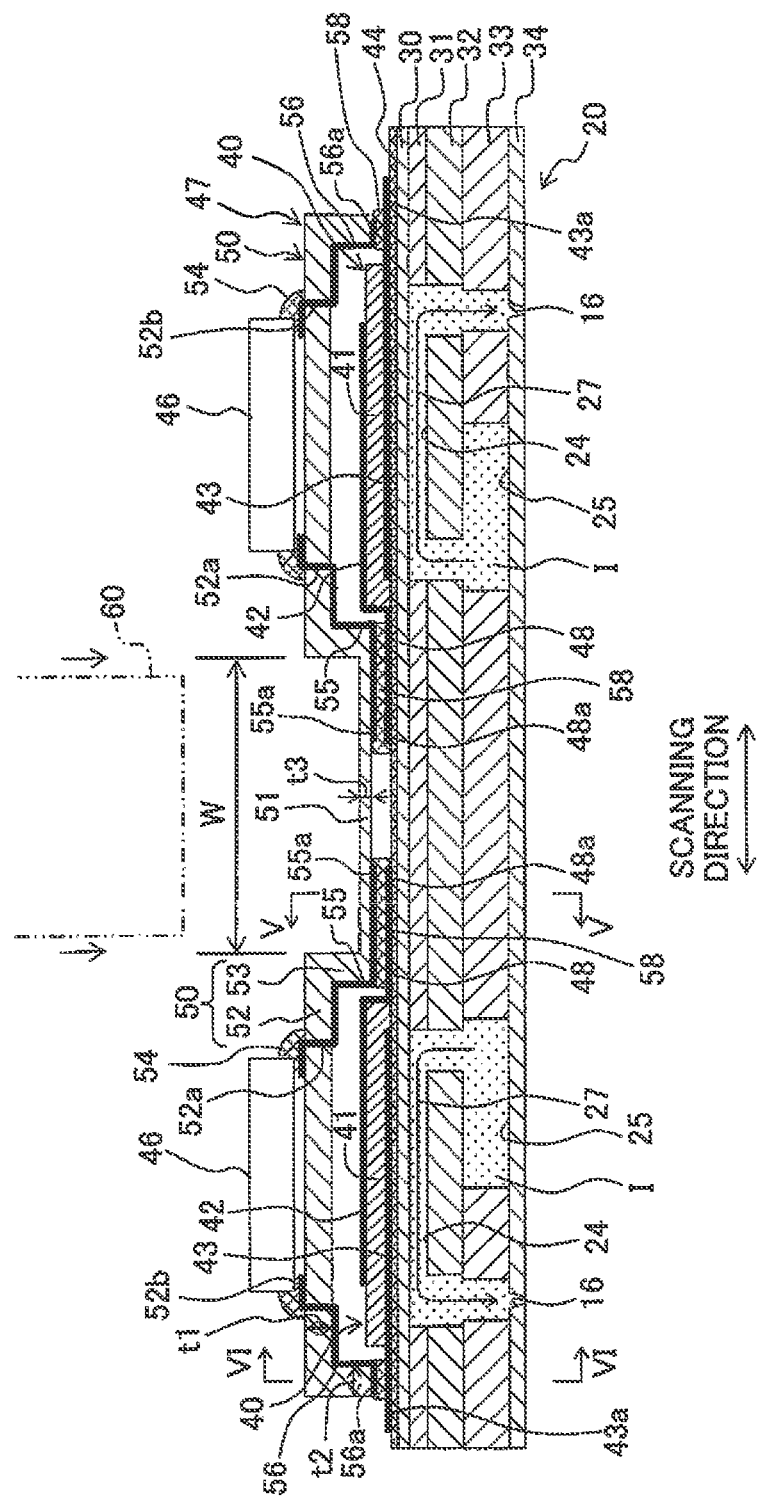
FIG. 4 is a cross-sectional view taken along a line IV-IV of FIG. 2.

As shown in FIGS. 2 and 3, an ink supply hole 26 connected to each of the ink cartridges 17 (see FIG. 1) is formed on the upper surface of the channel unit 20. Two manifolds 25 each extending in the transport direction are formed in the channel unit 20. The two manifolds 25 are connected to the same ink supply hold 26, and the ink supplied from each of the ink cartridges 17 is supplied to the two manifolds 25.

The channel unit 20 includes the plurality of nozzles 16, which are formed in a nozzle plate 34 as the lowermost layer to open in the lower surface of the channel unit 20, and a plurality of pressure chambers 24 which are communicated with the nozzles 16 respectively. As shown in FIG. 3, the nozzles 16 are aligned in two arrays in the transport direction in the lower surface (surface on the back side of the page of FIG. 3) of the channel unit 20. The nozzles 16 are arranged in a so-called zigzag or staggered form in which positions of the nozzles 16 in the two arrays of left and right nozzle arrays are misaligned or shifted mutually in the transport direction.

Each of the pressure chambers 24 has a substantially elliptical shape elongated in the scanning direction as viewed in a plan view. The pressure chambers 24 are arranged planarly or as two-dimensional arrays, and covered with a vibration plate 30 as the uppermost layer from above. The pressure chambers 24 are arranged in zigzag in the transport direction to form two pressure chamber arrays which correspond to the two nozzle arrays, respectively. Each of the pressure chambers 24 is communicated with the corresponding nozzle 16 at one end in the longitudinal direction thereof. As shown in FIGS. 3 and 4, in the nozzle array disposed on the left side, each of the nozzles 16 is communicated with the left end of one of the pressure chambers 24; in the nozzle array disposed on the right side, each of the nozzles 16 is communicated with the right end of one of the pressure chambers 24. Accordingly, the nozzles belonging to each of the two nozzle arrays are arranged to overlap with outside end portions of the pressure chambers belonging to one of the two pressure chamber arrays.

As shown in FIGS. 2 to 4, the two pressure chamber arrays are arranged to overlap with the two manifolds 25, respectively, and each of the pressure chambers 24 is communicated with one of the manifolds 25 positioned directly therebelow. Accordingly, as shown in FIG. 4, a plurality of individual ink channels 27, each of which branches from the manifold 25 through the pressure chamber 24 to the nozzle 16, are formed in the channel unit 20.

Next, the piezoelectric actuator 21 will be explained. The piezoelectric actuator 21 is arranged on the upper surface of the vibration plate 30 which is a plate as the uppermost layer of the channel unit 20. As shown in FIGS. 2 to 6, the piezoelectric actuator 21 includes a piezoelectric body 40, a plurality of individual electrodes 42, and a common electrode 43.

As shown in FIG. 4, an insulating film 44, which is made of an insulating material such as a synthetic resin material, is formed on the substantially entire upper surface of the vibration plate 30. Two piezoelectric bodies 40, each of which has a rectangular shape as viewed in a plan view, are disposed on the upper surface of the vibration plate 30 covered with the insulating film 44. Each of the piezoelectric bodies 40 is made of a piezoelectric material which is composed primarily of ferroelectric lead zirconate titanate (PZT), and is a solid solution of lead titanate and lead zirconate. Each of the piezoelectric bodies 40 can be directly formed on the upper surface of the vibration plate 30 covered with the insulating film 44 by a known film forming technology such as a sputtering method and a sol-gel method. Alternately, each of the piezoelectric bodies 40 can be formed such that a piezoelectric sheet, which is obtained by calcining or sintering an unsintered thin green sheet, is stuck onto the vibration plate 30. Further, as shown in FIGS. 2 and 3, each of the piezoelectric bodies 40 is arranged to cover one of the two pressure chamber arrays so that the longitudinal direction of each of the piezoelectric bodies 40 is parallel to the alignment direction of the nozzles.

Each of the individual electrodes 42 is formed in an area, of the upper surface of each piezoelectric body 40, facing one of the pressure chambers 24. As a result, similar to the pressure chambers 24, the individual electrodes 42 are aligned in two rows in the alignment direction of the nozzles. Each of the individual electrodes 42 has a substantially elliptical shape slightly smaller than the pressure chamber 24 as viewed in a plan view, and is arranged to face the center portion of the corresponding pressure chamber 24.

On the upper surface of the vibration plate 30 covered with the insulating film 44, a plurality of first individual wiring sections 48 (first wiring sections), each of which is connected to the end portion, of one of the individual electrodes 42, positioned on the side opposite to the nozzle 16 as viewed in a plain view, are formed. In each of the first individual wiring sections 48, it is formed a first land 48a connected to be electrically conductive with one of a plurality of second individual wiring sections 55 formed in the cover member 47 as will be described later. Each of the first individual wiring sections 48 is drawn from the end portion of the corresponding individual electrode 42 in the longitudinal direction of the pressure chamber 24 (scanning direction). In particular, as shown in FIG. 3, the first individual wiring sections 48, each of which is connected to one of the individual electrodes 42 disposed on the left side thereof are drawn to the right side in the scanning direction, and the first individual wiring sections 48, each of which is connected to one of the individual electrodes 42 disposed on the right side thereof are drawn to the left side in the scanning direction. As a result, it is configured so that the first lands 48a are arranged between two arrays of the individual electrodes 42. Each of the individual electrodes 42 is connected to the driver IC 46 mounted on the cover member 47 via each of the first individual wiring sections 48 and each of the second individual wiring sections 55 formed on the cover member 47.

Two common electrodes 43, which correspond to the two pressure chamber arrays respectively, are formed on the upper surface of the vibration plate 30 covered with the insulating film 44. Each of the common electrodes 43 extends over the pressure chambers 24 forming one pressure chamber array in the alignment direction of the nozzles, and is brought in contact with the substantially entire lower surface of the corresponding piezoelectric body 40. Further, as shown in FIG. 3, each of the common electrodes 43 is pulled out from an area overlapping with the lower surface of the corresponding piezoelectric body 40 to the outside, namely, in a direction opposite to a direction in which each of the first wiring sections 48 is drawn from one of the individual electrodes 42. The drawn portion (hereinafter referred to as a drawn electrode portion 43a) of each of the common electrodes 43 is connected to be electrically conductive with a corresponding common wiring section 56 formed in the cover member 47 as will be described later. Each of the common electrodes 43 is connected to the driver IC 46 via each of the drawn electrode portions 43a and each of the common wiring sections 56 formed on the cover member 47, and is constantly maintained at the ground potential.

As shown in FIG. 4, a portion, of each piezoelectric body 40, which faces one pressure chamber 24 and is sandwiched between one individual electrode 42 and the common electrode 43 (hereinafter also referred to as an active portion) is a portion which is deformed when a driving signal is supplied from the driver IC 46 to the individual electrode 42 to apply jetting energy to the ink in one pressure chamber 24, as will be described later on. The portion including the active portion, the individual electrode 42, and the common electrode 43 is also referred to as a "piezoelectric element 41". The active portion of each piezoelectric element 41 is polarized in the thickness direction. Further, the piezoelectric elements 41 are also aligned in two arrays corresponding to the two pressure chamber arrays. In this embodiment, by arranging one piezoelectric body 40 to extend over the pressure chambers 24 belonging to one pressure chamber array, the piezoelectric elements 41, which form one piezoelectric element array corresponding to one pressure chamber array, are configured integrally. In this embodiment, although each of the individual electrodes 42 is arranged on the upper surface of one of the piezoelectric bodies 40 and each of the common electrodes 43 is arranged on the lower surface of one of the piezoelectric bodies 40, the arrangement of the electrodes 42 and 43 may be reversed. That is, each of the common electrodes 43 may be arranged on the upper surface of one of the piezoelectric bodies 40 and each of the individual electrodes 42 may be arranged on the lower surface of one of the piezoelectric bodies 40.

Two driver ICs 46 are provided corresponding to the two piezoelectric bodies 40, respectively. The two driver ICs 46 are respectively mounted on the upper surface of the cover member 47 which will be described later. Each of the driver ICs 46 has a rectangular shape as viewed in a plan view and is arranged so that the longitudinal direction of the rectangular shape is along with the alignment direction of the nozzles. Various circuits for driving the piezoelectric elements 41 are incorporated in each of the driver ICs 46. Each of the two driver ICs 46 is connected to an unillustrated control board and various control signals are sent from the control board to each of the two driver ICs 46. Each of the driver ICs 46 outputs a driving signal generated based on the control signal inputted from the control board to each of the individual electrodes 42 and thereby driving the piezoelectric elements 41 separately.

An explanation will be made about the operation of each piezoelectric element 41 when the driving signal is inputted. In a case that the driving signal is inputted from the driver IC 46 to one individual electrode 42, potential difference occurs between this individual electrode 42 and the common electrode 43. Hence, an electric field in the thickness direction acts on the portion (active portion) of the piezoelectric body 40 sandwiched by the two electrodes 42 and 43. The direction of the electric field is parallel to the polarization direction of the active portion of the piezoelectric element 41, and thus the piezoelectric element 41 extends in the thickness direction and contracts in the plane direction. The contraction of the piezoelectric element 41 in the plane direction allows the vibration plate 30 covering the pressure chamber 24 to bend to be convex toward the pressure chamber 24, and thereby decreasing the volume of the pressure chamber 24. At this time, the pressure (jetting energy) is applied to the ink in the pressure chamber 24 and droplets of the ink are discharged from the nozzle 16.

Next, an explanation will be made about the cover member 47. The cover member 47 is joined to the channel unit 20 in a state of covering the two piezoelectric bodies 40 so that the two piezoelectric bodies 40 are cut off from the outside air to prevent outside wet (moisture) from entering each of the piezoelectric elements 41. Further, the cover member 47 also functions as a wiring member in which the wiring sections 55 and 56 which electrically connect each driver IC 46 to the internal piezoelectric elements 41, are formed. Therefore, the cover member 47 is preferably made of a material which is suitable for forming the wirings. Such a material includes, for example, polyimide, alumina, aluminum nitride, and silicon. As shown in FIGS. 2 to 6, the cover member 47 includes two cover body sections 50 covering two piezoelectric bodies 40 (two piezoelectric element arrays) respectively and a wiring connection section 51 provided to join the two cover body sections 50.

Each of the cover body sections 50 is formed into a box-like rectangular shape as viewed in a plan view. Each of the cover body sections 50 includes a ceiling portion 52, which extends in a horizontal direction to face the upper surface of the vibration plate 30 while sandwiching the piezoelectric body 40 (the piezoelectric elements 41) therebetween, and a side wall portion 53, which extends in the vertical direction to join the ceiling portion 52 and the channel unit 20. Here, each of the cover body sections 50 is configured so that the surface facing the ceiling portion 52 is open, and each of the cover body sections 50 entirely covers the corresponding piezoelectric body 40 having the rectangular shape from above by being arranged such that the ceiling portion 52 is positioned on the upper side. Further, as shown in FIG. 4, in each of the cover body sections 50, a thickness t1 of the ceiling portion 52 is substantially same as a thickness t2 of the side wall portion 53. Noted that the "thickness" of the cover body section 50 indicates a thickness in a direction perpendicular to the surface (outer surface) of the cover body section 50. The two driver ICs 46 are arranged on the upper surfaces of the ceiling portions 52 of the two cover body sections 50, respectively. An insulating material 54 is injected into the periphery of a plurality of terminals of each of the driver ICs 46 to prevent a shirt circuit and the like. Further, each of the cover body sections 50 covers the piezoelectric body 40 (piezoelectric elements 41) in a state that a gap is provided between the cover body section 50 and the piezoelectric body 40. Thus, when each of the piezoelectric elements 41 is driven, the deformation of each of the piezoelectric elements 41 is not obstructed by each of the cover body sections 50.

Figure 5:
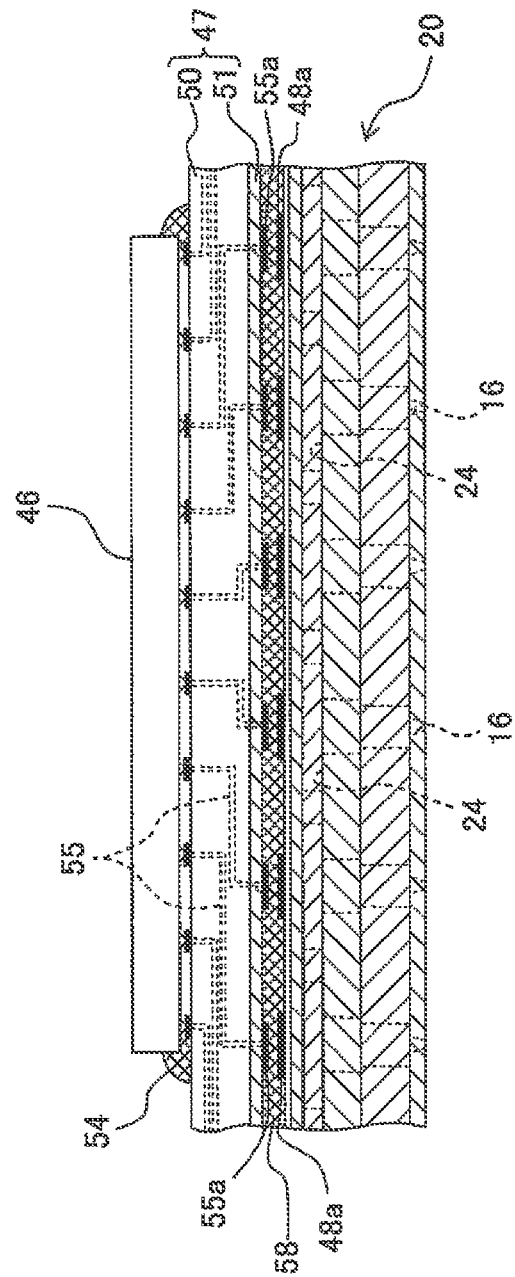
FIG. 5 is a cross-sectional view taken along a line V-V of FIG. 4.
Figure 6:
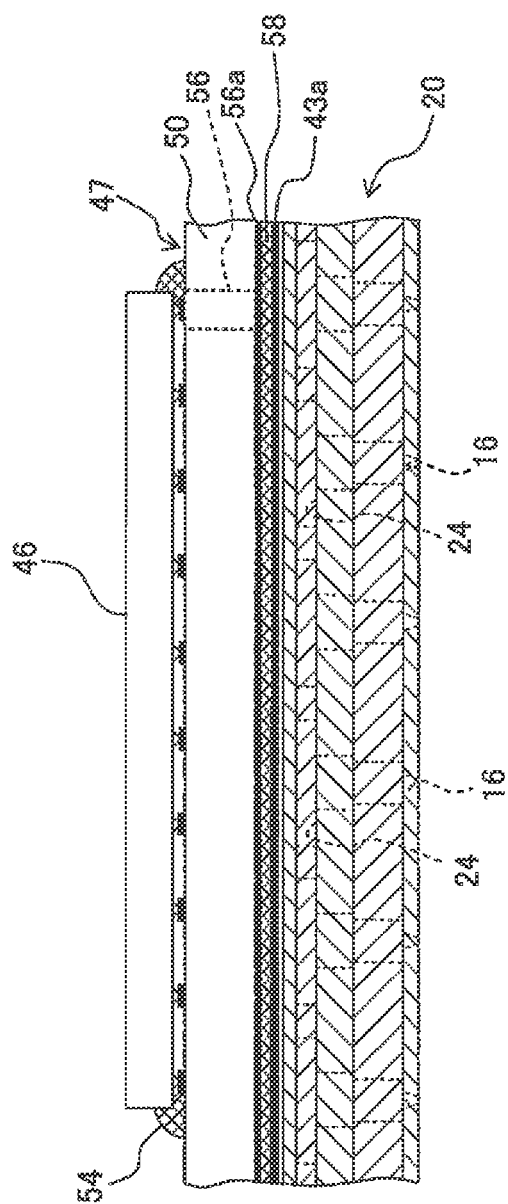
FIG. 6 is a cross-sectional view taken along a line VI-VI of FIG. 4.

The wiring connection section 51 extends along the vibration plate 30 from respective inside ends of the side wall portions 53 of the two cover body sections 50. Accordingly, the two right and left cover body sections 50 are joined by the wiring connection section 51 disposed therebetween. As shown in FIGS. 4 and 5, the wiring connection section 51 faces the first lands 48a of the first individual wiring sections 48 which are respectively drawn inward from two arrays of the individual electrodes 42. That is, the first lands 48a pulled from two arrays of the individual electrodes 42 (two arrays of the piezoelectric elements 41) covered with the two cover body sections 50 respectively are opposed to the same wiring connection section 51. As shown in FIGS. 4 and 6, the lower surfaces of the outside ends of respective cover body sections 50, which are positioned on the side opposite to the wiring connection section 51, face the drawn electrode portions 43a of respective common electrodes 43. Further, a thickness t3 of the wiring connection section 51 is thinner than the thickness t1 of the ceiling portion 52 and the thickness t2 of the side wall portion 53 of the cover body section 50. For example, the thickness t1 is 1 mm, the thickness t2 is 1 mm, and the thickness t3 is 0.2 mm. Noted that the "thickness" of the wiring connection section 51 means a thickness in a direction perpendicular to the extending direction of the wiring connection section 51 (a direction perpendicular to the direction along the plane of the vibration plate 30).

As shown in FIG. 4, the second individual wiring sections 55, each of which connects the individual electrode 42 to the driver IC 46, and the common wiring sections 56, each of which connects the common electrode 43 to the driver IC 46, are formed in the cover member 47.

A second land 55a is formed at one end of each of the second individual wiring sections 55. As shown in FIG. 5, the second lands 55a are arranged, on the lower surface of the wiring connection section 51 of the cover member 47 (the surface facing the first lands 48a), with a spacing distance intervening therebetween, so that the second lands 55a are opposed to the first lands 48a, respectively. Then, as shown in FIGS. 4 and 5, each of the second individual wiring sections 55 is drawn from the second land 55a on the lower surface of the wiring connection section 51 through the inner surfaces of the side wall portion 53 and the ceiling portion 52 of the cover body section 50 to arrive at the outer surface (upper surface) of the ceiling portion 52 via a through hole 52a formed in the ceiling portion 52. The end portion, of each of the second individual wiring sections 55, on the side opposite to the second land 55a is connected to the driver IC 46 on the upper surface of the ceiling portion 52.

As shown in FIG. 6, a connection electrode portion 56a is formed at one end of the common wiring section 56. The connection electrode portion 56a is an electrode portion having a large area which is formed in the entire lower surface of the outside end, of the side wall portion 53 of each cover body section 50, on the side opposite to the wiring connection section 51. The entire surface of the connection electrode portion 56a faces the drawn electrode portion 43a of the common electrode 43. Similar to the second individual wiring sections 55, each of the common wiring sections 56 is drawn from the connection electrode portion 56a as the one end thereof through the inner surfaces of the side wall portion 53 and the ceiling portion 52 of the cover body section 50 to arrive at the outer surface (upper surface) of the ceiling portion 52 via a through hole 52b formed in the ceiling portion 52. Then, the common wiring section 56 is connected to the driver IC 46 on the upper surface of the ceiling portion 52. As shown in FIG. 6, in order to prevent each common electrode 43 from changing from the ground potential, a space between the adjacent common wiring sections 56 is greater than a space between the adjacent second individual wiring sections 55 shown in FIG. 5, so that electrical resistance between the common electrode 43 and the driver IC 46 is reduced as much as possible. Although only one common wiring section 56 is illustrated in FIG. 6, the connection electrode portions 56a and the driver IC 46 may be connected by a plurality of common wiring sections 56.

As described above, each of the second individual wiring sections 55 is drawn from the surface of the wiring connection section 51 facing the first land 48a through the inner surface of the cover body section 50 to arrive at the outer surface of the ceiling portion 52 via the through hole 52a formed in the cover body section 50. That is, only the portion, of each of the second individual wiring sections 55, which is drawn up to the outside from the through hole 52a of the cover body section 50 is exposed and a large portion other than the above exposed portion is positioned inside the cover member 47 and is not exposed. Thus, short circuit between the adjacent second individual wiring sections 55, damage of the second individual wiring sections 55, and the like are prevented. Further, the through hole 52a of each of the cover body sections 50 is formed in the ceiling portion 52 in which the driver IC 46 is provided. Thus, the portion, of each of the second individual wiring sections 55, which is positioned in the outer surface of the cover body section 50 so as to be exposed is small. Noted that, each of the common wiring sections 56 has a similar structure and the exposed portion thereof is small, and thus damage of the common wiring sections 56 and the like are prevented. Further, since there is a space between each piezoelectric body 40 and the cover member 47 covering each piezoelectric body 40, each piezoelectric element 41 does not make contact with the second individual wiring section 55 and the common wiring section 56 formed in the internal surface of the cover body section 50 at the time of driving each piezoelectric element 41. Thus, disconnection, damage, and the like of the wiring sections 55 and 56 do not occur.

The cover member 47 is joined onto the upper surface of the vibration plate 30 of the channel unit 20 in a state that the second land 55a of each of the second individual wiring sections 55 is electrically conductive with the first land 48a of each of the first individual wiring sections 48 and that the connection electrode portion 56a of each of the common wiring sections 56 is electrically conductive with the drawn electrode portion 43a of each of the common electrodes 43. In this embodiment, the cover member 47 and the channel unit 20 are joined to each other by an anisotropic conductive adhesive 58 (an anisotropic conductive film (ACF) or an anisotropic conductive paste (ACP)).

The joining of the cover member 47 using the anisotropic conductive adhesive 58 is performed, for example, as follows. That is, the anisotropic conductive adhesive is an adhesive in the form of the film (ACF) or the paste (ACP) in which conductive particles are dispersed in a thermosetting resin such as epoxy resin. At first, the anisotropic conductive adhesive 58 is provided on the upper surface of the vibration plate 30, in areas inside the two piezoelectric bodies 40 in which the first lands 48a are arranged and in areas outside the two piezoelectric bodies 40 in which the two drawn electrode portions 43a are arranged, so as to cover the first lands 48a and the drawn electrode portions 43a. Subsequently, the cover member 47 is positioned and provided on the anisotropic conductive adhesive 58.

Next, a heater 60 is pressed against the cover member 47 and the cover member 47 is pressed to the channel unit 20 while being heated by the heater 60. In FIG. 4, the heater 60 for pressing the wiring connection section 51 against the channel unit 20 is shown. The width of the heater 60 is narrower than the width W of the wiring connection section 51.

By pressing the cover member 47 against the channel unit 20 while heating the cover member 47 by the heater, the anisotropic conductive adhesive 58 is compressed between the first land 48a and the second land 55a for each of the individual electrodes 42 and between the drawn electrode portion 43a and the connection electrode portion 56a for each of the common electrodes 43. In this situation, although the thermosetting resin in the adhesive is pushed out laterally, many conductive particles remain between the lands 48a and 55a and between the electrode portions 43a and 56a. Accordingly, conductivity is expressed, and the first lands 48a are electrically conductive with the second lands 55a and the drawn electrode portions 43a are electrically conductive with the connection electrode portions 56a. At the same time, by curing the thermosetting resin in the adhesive by heating, the entire circumference of the cover member 47 is mechanically joined to the vibration plate 30 of the channel unit 20 and each piezoelectric body 40 (piezoelectric elements 41) in the cover member 47 is hermetically closed. By joining the cover member 47 in which the wiring sections 55 and 56 are formed to the channel unit 20 as described above, the piezoelectric elements 41 can be electrically connected to each driver IC 46 easily. Noted that in a case that the anisotropic conductive adhesive 58 is used, the conductivity is expressed in a compression direction (direction of pressing applied by the heater 60 in FIG. 4) and the conductivity is not expressed in a direction perpendicular to the compression direction (plane direction of the vibration plate 30). That is, in the direction of pressing applied by the heater 60 shown in FIG. 4, each first land 48a and each second land 55a opposed to each other are electrically connected to each other by the anisotropic conductive adhesive 58, and each drawn electrode portion 43a and each connection electrode portion 56a for the common electrode 43 are electrically connected to each other by the anisotropic conductive adhesive 58. However, two first lands 48 adjacent with respect to a direction perpendicular to the sheet surface of FIG. 4 are not electrically connected by the anisotropic conductive adhesive 58. The same is true on two second lands 55a, two drawn electrode portions 43a, and two connection electrode portions 56a, those of which are adjacent with respect to the direction perpendicular to the sheet surface of FIG. 4.

For suppressing permeation of outside wet (moisture) to protect the piezoelectric elements 41 from the moisture, each of the cover body sections 50, of the cover member 47, covering each of the piezoelectric bodies 40 preferably has a thickness of not less than a certain thickness. Meanwhile, in a case that the wiring connection section 51 is pressed against the vibration plate 30 by the heater 60, the wiring connection section 51 is required to be deformed depending on an inclination and/or a curve on the side of the vibration plate 30, or a minute concave-convex shape, so that the first lands 48a are reliably brought in contact with the second lands 55a. That is, it is preferable that the wiring connection section 51 is formed thinly and can be deformed depending on the surface shape of the vibration plate 30 in order to improve conductive reliability between the first lands 48a and the second lands 55a. Therefore, as shown in FIG. 4, the thickness t3 of the wiring connection section 51 is thinner than the thickness t1 of the ceiling portion 52 and the thickness t2 of the side wall portion 53 of the cover body section 50. Accordingly, the first individual wiring sections 48 can be electrically conductive with the second individual wiring sections 55 reliably.

As shown in FIG. 6, unlike the second land 55a having a small area, the connection electrode portion 56a for the common electrode 43 has a large area and makes contact with the drawn electrode portion 43a on the side of the vibration plate 30. Therefore, even when the surface, of the cover member 47, in which the connection electrode portion 56a is provided is pressed against the upper surface of the vibration plate 30 locally or unevenly, the conduction state is maintained provided that a part of the connection electrode portion 56a is brought into contact with the drawn electrode portion 43a. That is, the conduction between the drawn electrode portion 43a and the connection electrode portion 56a is easily ensured as compared with the conduction between the first land 48a and the second land 55a. From this reason, unlike each of the second lands 55a provided in the thin wiring connection section 51, each of the connection electrode portions 56a is formed on the lower surface of the side wall portion 53 of one of the cover body sections 50 having a high rigidity.

Further, in this embodiment, the cover member 47 is joined to the vibration plate 30 of the channel unit 20 by the anisotropic conductive adhesive 58. For the anisotropic conductive adhesive 58, no conductivity is expressed unless the compression force is enough. In this regard, in a case that the wiring connection section 51 is formed thinly as described above, the wiring connection section 51 is deformed depending on the upper surface of the vibration plate 30 and the anisotropic conductive adhesive 58 is more likely to be pressed against the lower surface of the wiring connection section 51 and the upper surface of the vibration plate 30 wholly and uniformly, even when the lower surface of the wiring connection section 51 and the upper surface of the vibration plate 30 have concavities and convexities. Therefore, the conductivity is reliably expressed between the first lands 48a and the second lands 55a, respectively.

In this embodiment, as shown in FIG. 5, the first lands 48a are arranged on the upper surface of the vibration plate 30 with a spacing distance intervening therebetween, and the second lands 55a are arranged on the lower surface of the wiring connection section 51 with a spacing distance intervening therebetween. Therefore, the upper surface of the vibration plate 30 and the lower surface of the wiring connection section 51 each have a surface profile such that convex areas having the lands and concave areas having no land are arranged alternately. Here, in a case that the first lands 48a or the second lands 55a have mutually different wiring thicknesses, the convex areas of the first lands 48a or the second lands 55a vary in height. Then, there is fear that the first lands 48a or the second lands 55a vary in the compression amount of the anisotropic conductive adhesive 58, and conduction can not be made in the land(s) having a small wiring thickness. Further, although the thickness of each first land 48a is about 1 μm, the size of the cover member 47 in which each second land 55a is formed is 10 to 20 mm. Thus, concavities and convexities which are much greater than the thickness of the first lands 48a may be generated on the lower surface of the wiring connection section 51 due to dimension tolerance. From this viewpoint, the second lands 55a are considered to have the variation of height greater than that of the first lands 48a. In this embodiment, since the wiring connection section 51 is formed thinly, even when the first lands 48a or the second lands 55a vary in height, the wiring connection section 51 is deformed in accordance with the variation of height and it is possible to absorb the variation of height.

Further, in a case that the cover member 47 is joined to the channel unit 20 by using the anisotropic conductive adhesive 58, the thermosetting resin in the adhesive is distributed between the vibration plate 30 of the channel unit 20 and the cover member 47. Thus, it is less likely to generate a gap between the channel unit 20 and the wiring connection, and closeness or airtightness of the piezoelectric elements 41 by the cover member 47 is improved.

As shown in FIGS. 3 and 4, two cover body sections 50, which cover two arrays of the individual electrodes 42 (two arrays of the piezoelectric elements 41) respectively, are connected by one wiring connection section 51 arranged therebetween in this embodiment. In this configuration, the first individual wiring sections 48, which are drawn from the two arrays of the individual electrodes 42 respectively, can be connected to the second individual wiring sections 55 respectively by one wiring connection section 51. Further, as shown in FIG. 4, in a case that the wiring connection section 51 is joined to the channel unit 20, it is necessary that the heater 60 is pressed against the wiring connection section 51 and that the width W of the wiring connection section 51 is greater than the width of the heater 60. In this regard, by using the same wiring connection section 51 for the two arrays of the individual electrodes 42, the number of wiring connection sections 51 is reduced and thereby making it possible to downsize the ink-jet head. Alternatively, by using the same wiring connection section 51 for the two arrays of the individual electrodes 42, a heater 60 having a large width can be used and thereby making it possible to press the wiring connection section 51 against the heater 60 more uniformly.

Next, modified embodiments in which the above-described embodiment is variously modified will be explained. However, components having the structures similar to those of the above-described embodiment will be denoted by the same reference numerals and symbols, and explanation thereof will be omitted when appropriate.

Figure 7:
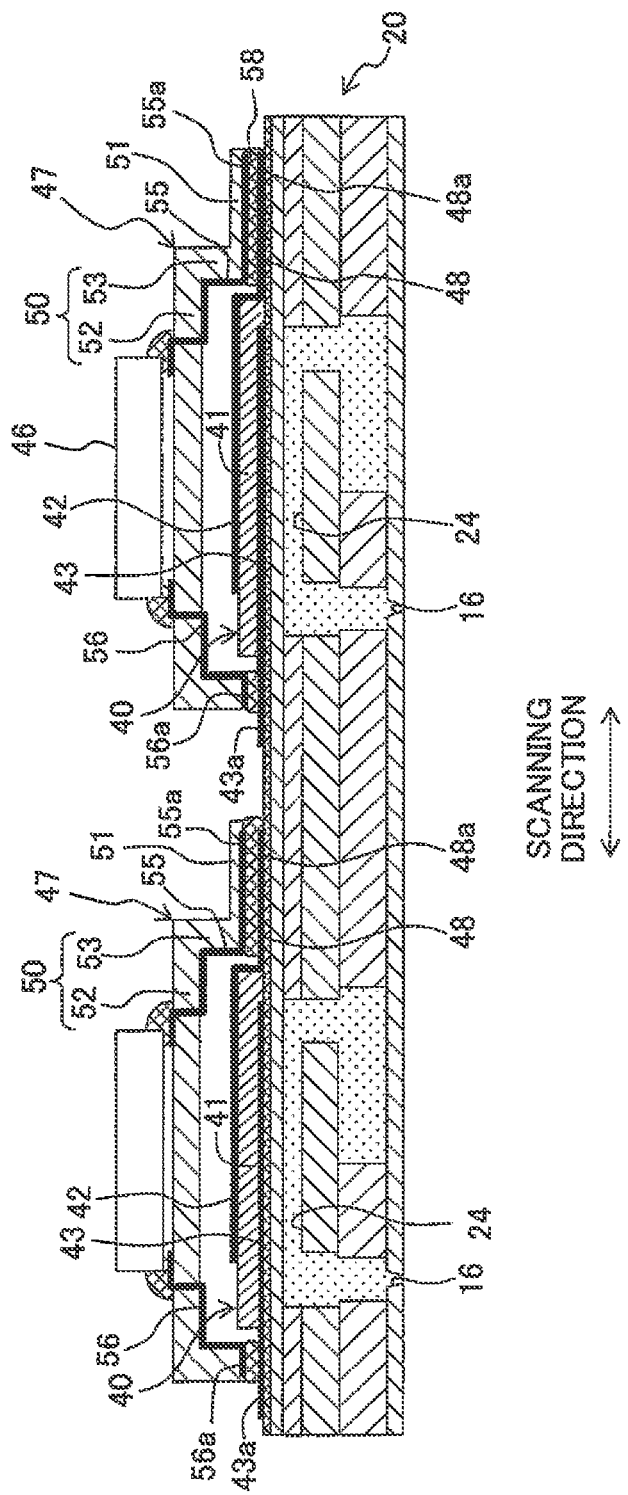
FIG. 7 is a cross-sectional view of an ink-jet head according to a modified embodiment.

In the above embodiment, the two cover body sections 50, each of which covers one of the two piezoelectric bodies 40, are connected by one wiring connection section 51, and the two piezoelectric bodies 40 share the wiring connection section 51. However, as shown in FIG. 7, two wiring connection sections 51 may be respectively provided in the two cover body sections 50, each of which covers one of the two piezoelectric bodies 40.

Figure 8:
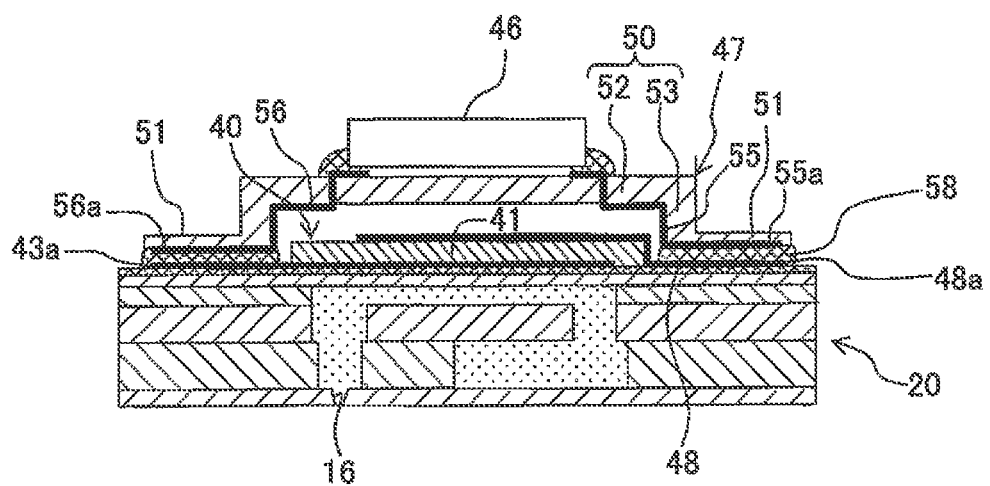
FIG. 8 is a cross-sectional view of an ink-jet head according to another modified embodiment.

In the above embodiment, only the second lands 55a connected to the individual electrodes 42 are provided in the thin wiring connection section 51 of the cover member 47. However, as shown in FIG. 8, two wiring connection sections 51 may be provided in the cover member 47 and the connection electrode portion 56a connected to the common electrode 43 may be also provided in one of the thin wiring connection sections 51. In this case, by deforming the wiring connection section 51 in which the connection electrode portion 56a is formed depending on the surface profile of the vibration plate 30, the substantially entire surface of the connection electrode portion 56a can be brought into contact with the drawn electrode portion 43a of the common electrode 43. Thus, it is possible to reduce electrical resistance between the driver IC 46 and the common electrode 43.

Figure 9:
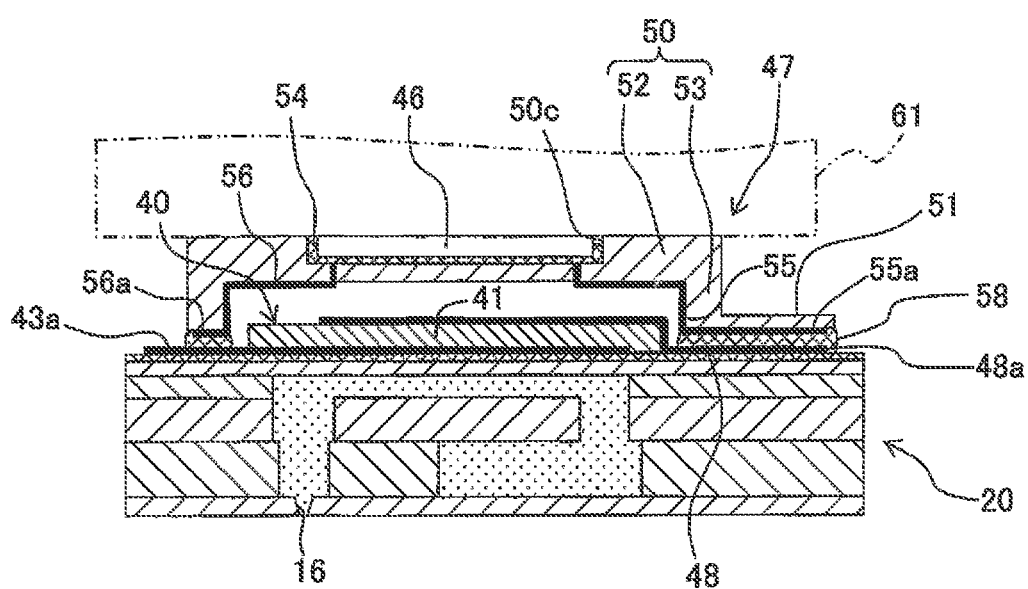
FIG. 9 is a cross-sectional view of an ink-jet head according to still another modified embodiment.

As shown in FIG. 9, it is allowable that a concave portion 50c is formed in the cover body section 50 and the driver IC 46 is provided in the cover body section 50 in a state of being accommodated in the concave portion 50c. By accommodating the driver IC in the concave portion 50c, the driver IC 46 does not protrude from the cover body section 50 and is protected. Further, in a case that the piezoelectric elements 41 are driven, a great deal of heat is generated in the driver IC 46 and the majority of the heat is conducted to the cover body section 50. Here, since the driver IC 46 does not protrude from the cover body section 50, a heat sink 61 can be provided to have a surface-to-surface contact with the cover body section 50 over a large area as shown in FIG. 9, so that the heat conducted to the cover member 47 radiates effectively. Further, in a case that the driver IC 46 is accommodated in the concave portion 50c of the cover member 47 and that the insulating material 54 for preventing the shirt circuit is injected into terminals of the driver IC 46, the insulating material 54 is less likely to flow out.

In a case that the piezoelectric elements 41 are driven, a part of heat generated in the driver IC 46 is conducted to the channel unit 20 via the cover member 47 in which the driver IC 46 is provided. As a result, the temperature of the ink flowing through the channel unit 20 increases. In a case that the nozzles 16 vary in the temperature of the ink, the nozzles 16 vary in jetting characteristics (jetting amount and/or jetting velocity of droplets of ink) and thus printing quality is decreased. Therefore, the temperature of the ink supplied to each of the nozzles 16 is desirably to be maintained uniformly.

In view of this, in the configuration in which the driver IC 46 is provided in the ceiling portion 52 of the cover body section 50, the heat resistance of the side wall portion 53 which connects the ceiling portion 52 and the channel unit 20 is allowed to vary in portions of the manifold 25 on the upstream side and the downstream side, and thereby controlling the conduction of heat from the cover member 47 to the ink flowing thorough the manifold 25. Noted that the "heat resistance" is a physical property value indicating difficulty in conducting the heat, and ° C./W or the like is used as a unit.

Figure 10:
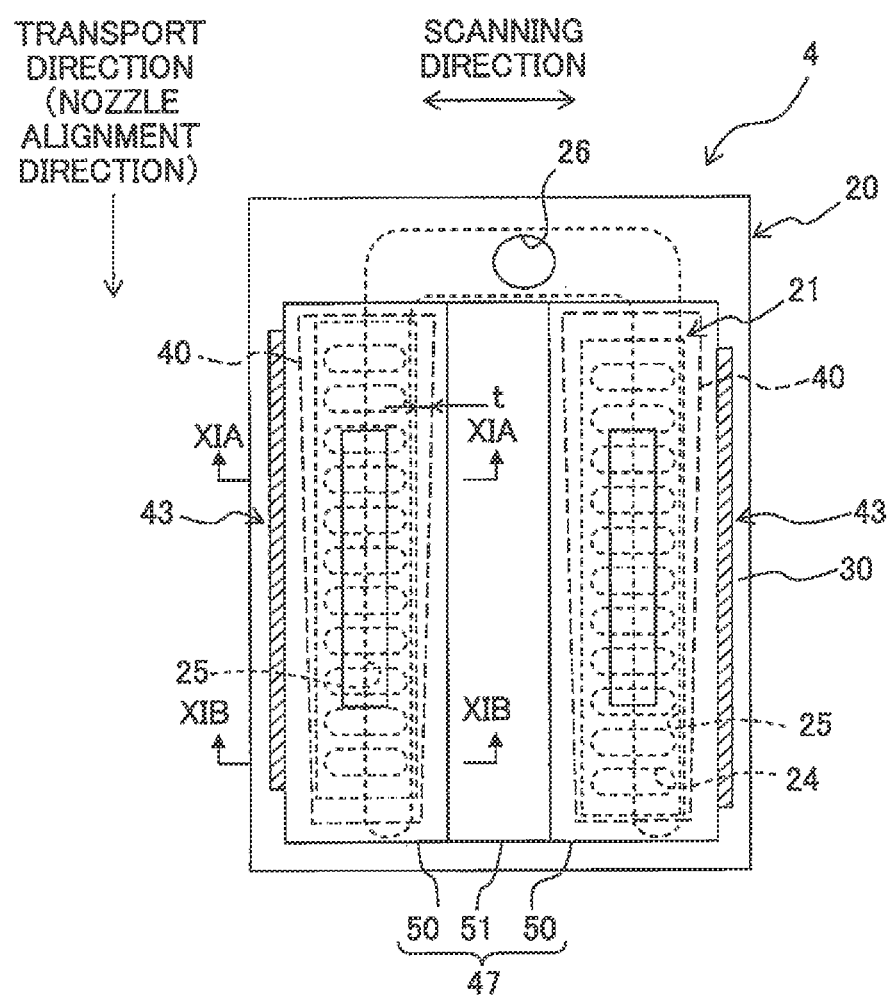
FIG. 10 is a plan view of an ink-jet head according to yet another modified embodiment.
Figure 11A:
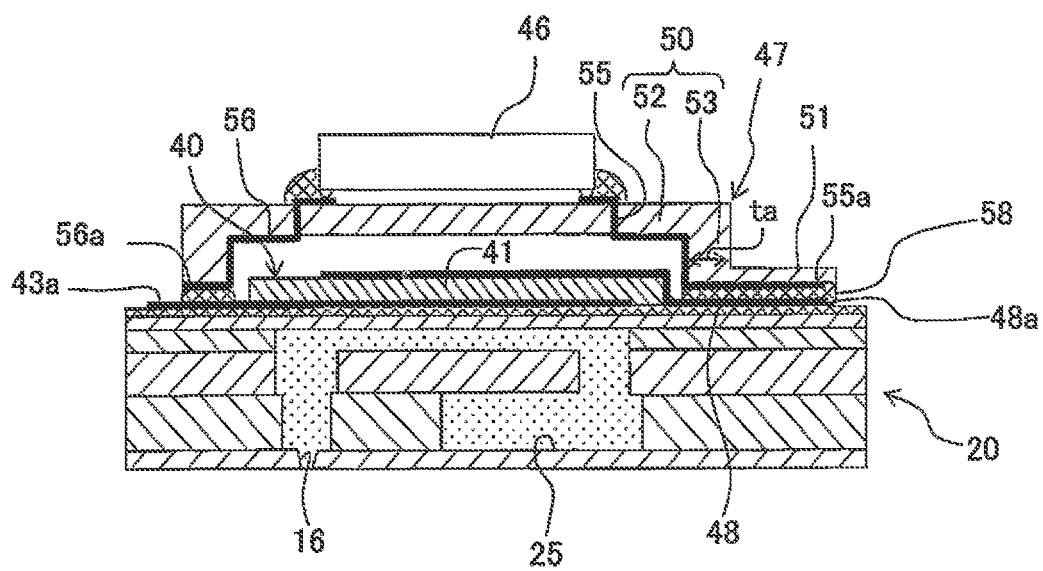
FIG. 11A is a cross-sectional view taken along a line XA-XA of FIG. 10
Figure 11B:
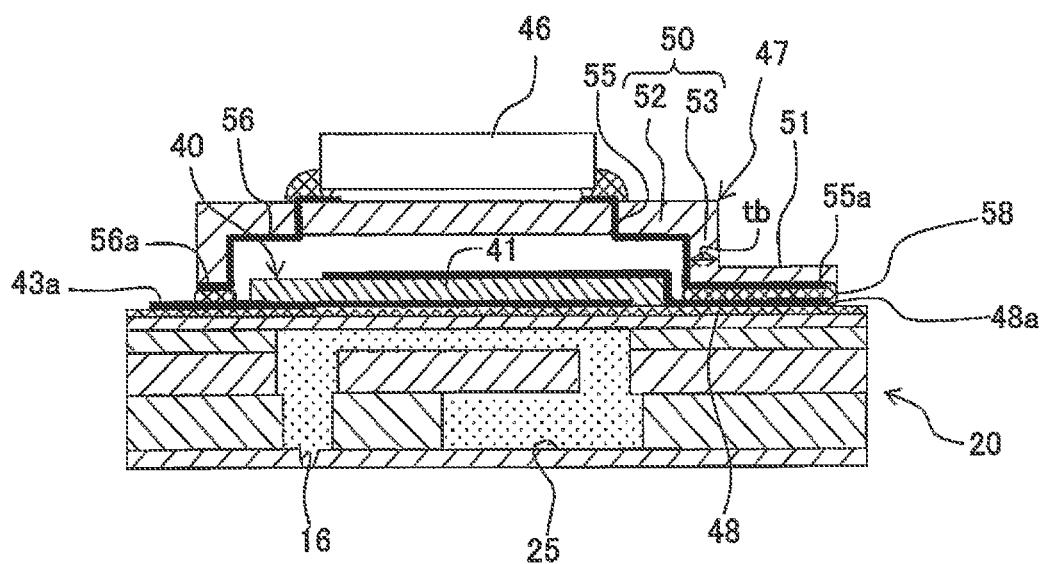
FIG. 11B is a cross-sectional view taken along a line XB-XB of FIG. 10.

Hereinbelow, a few specific examples will be given. As shown in FIGS. 10, 11A, and 11B, the side wall portion 53 of the cover member 47 extends along the manifold 25 (common liquid chamber). As described in the above embodiment, the manifolds 25 are communicated with the ink supply hole 26 (liquid supply section) connected to each ink cartridge 17 (liquid supply source, see FIG. 1). A thickness (t) of the side wall portion 53 increases at a portion closer to the ink supply hole 26 in the extending direction of the manifold 25 (for example, ta in FIG. 11A) and decreases at a portion further away from the ink supply hole 26 (for example, tb in FIG. 11B). In general, in a case that the heat conductivity is the same, the heat resistance increases as the cross-section area of a member conducting the heat is smaller. Thus, the heat is less likely to be conducted in the member having a smaller cross-section area.

Therefore, the heat resistance is low at a portion of the manifold 25 on the upstream side close to the ink supply hole 26, because the thickness of the side wall portion 53 is thick. On the other hand, the heat resistance is high at a portion of the manifold 25 on the downstream side away from the ink supply hole 26, because the thickness of the side wall portion 53 is thin. The temperature of the ink is relatively low at the portion of the manifold 25 on the upstream side, but the heat generated in the driver IC 46 is more likely to be conducted due to the low heat resistance of the side wall portion 53. On the other hand, the temperature of the ink has increased to some extent on the portion of the manifold 25 on the downstream side, because the ink is exposed to the heat while flowing through the manifold 25. However, since the heat resistance of the side wall portion 53 is high at this portion, it is suppressed that the temperature of the ink further increases by further exposing the ink to the heat. As described above, a great deal of heat is more likely to be conducted at the position, in the manifold 25, having a low ink temperature and the heat is less likely to be conducted at the position, in the manifold 25, having a high ink temperature, and thereby making the temperature difference in the ink flowing through the manifold 25 small. That is, it is possible to supply the ink having a small temperature difference from the manifold 25 to each of the nozzles 16.

Figure 13:
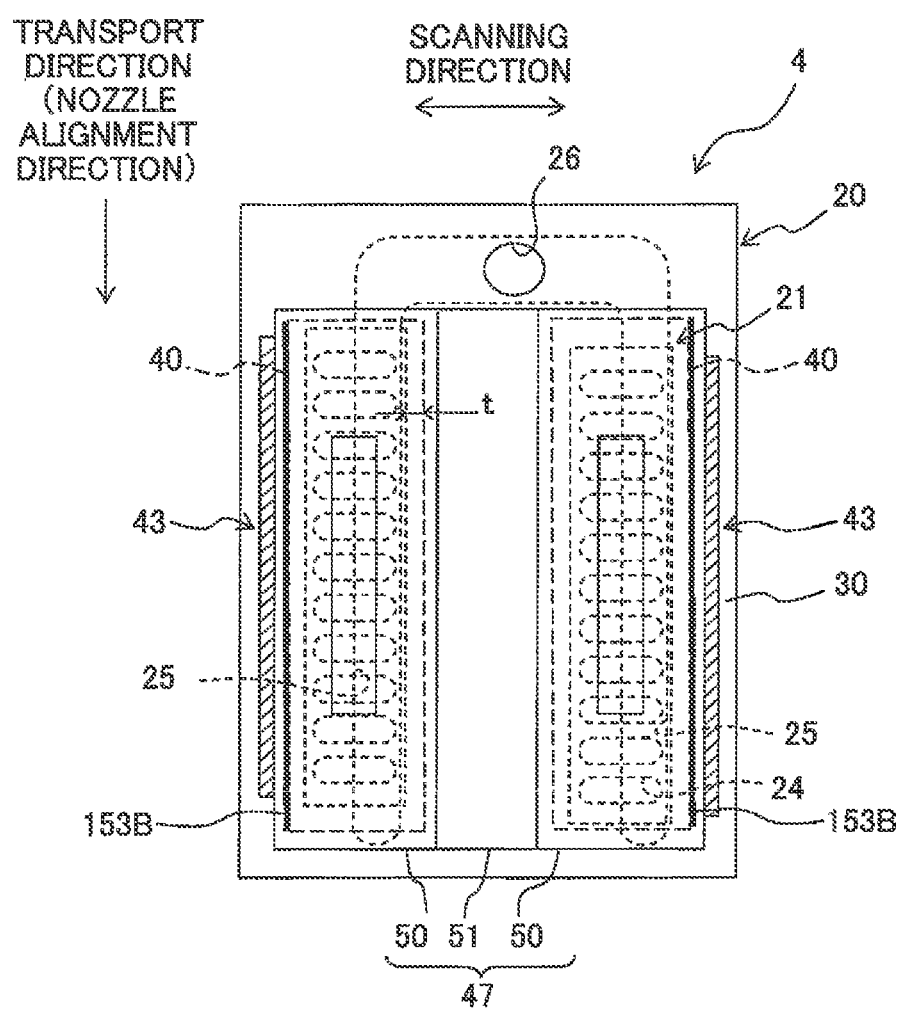
FIG. 13 is a plan view of an ink-jet head including a low heat-resistance portion 153B.

In the above description, it is disclosed that the heat resistance of the side wall portion 53 is gradually increased from the upstream side to the downstream side of the manifold 25 by gradually decreasing the thickness of the side wall portion 53 from the upstream side to the downstream side of the manifold 25. The present teaching, however, is not limited to this construction. For example, as shown in FIG. 12, it is possible to form a high heat-resistance portion 153A having a heat resistance higher than the periphery such that a part of the side wall portion 53 is allowed to have a thickness thinner than those of other portions. Further, as shown in FIG. 13, it is allowable to provide a portion having a small heat resistance (low heat-resistance portion 153B) by attaching a member having a heat resistance smaller than that of the side wall portion 53 (for example, metal foil such as copper foil) to the side wall portion 53. In this case, by adjusting the area of the low heat-resistance portion 153B to gradually decrease from the upstream side to the downstream side of the manifold 25, the heat resistance of the side wall portion 53 can be gradually increased from the upstream side to the downstream side of the manifold 25.

It is not indispensable to arrange each of the driver ICs 46 in the cover member 47. For example, each of the driver ICs 46 may be connected to the wiring sections 55 and 56 formed in the cover member 47 via a flexible wiring board connected to the cover member 47.

In the above embodiment, as shown in FIG. 3, one piezoelectric body 40 is arranged to extend over the pressure chambers 24, so that the piezoelectric elements 41 corresponding to the pressure chambers 24 respectively are configured integrally. However, the piezoelectric elements 41 may be arranged to be separated from each other.

In the above embodiment, a substantial portion of each of the wiring sections (second individual wiring sections 55 and common wiring sections 56) of the cover member 47 is drawn through the inner surface of one of the cover body sections 50. However, it is also allowable that each of the wiring sections is drawn up to the outer surface of one of the cover body sections 50 at an appropriate position so that the substantial portion of each of the wiring sections is drawn through the outer surface of one of the cover body sections 50.

In the above embodiment, the cover member 47 is joined to the channel unit 20 by the anisotropic conductive adhesive 58. However, the joining of the cover member 47 is not limited thereto. For example, the following joining is allowable. That is, the conduction between the lands 48a and 55a is made and the lands 48a and 55a are locally joined to each other by using a conductive adhesive at portions at which the first lands 48a of the vibration plate 30 face the second lands 55a of the wiring connection section 51. Then, a sealing material such as resin is injected between the joining portions of the lands 48a and 55a to close the inside of the cover member 47 hermetically. Alternatively, the joining can be performed by using a general insulating adhesive (for example, an epoxide-based adhesive). In this case, in order to make the electrical conduction between the first lands 48a and the second lands 55a, it is necessary that the first lands 48a and the second lands 55a are directly brought into contact with each other as follows. That is, when the joining is performed by the adhesive, the cover member 47 is pressed against the channel unit 20 sufficiently so that the adhesive between the first lands 48a and the second lands 55a is pushed out laterally.

In the above embodiment, one cover body section 50 of the cover member 47 covers the piezoelectric elements 41 aligned in one array commonly. The cover member 47, however, may include a plurality of cover sections 50, each of which covers one of the piezoelectric elements 41 individually. In the embodiment and its modified embodiments, it has been described that the cover member 47 contributes to prevent each piezoelectric element 41 from being exposed to the outside moisture. In addition to this, it is also possible to obtain effects, for example, such that foreign substances such as dust are prevented from adhering to the piezoelectric elements 41, wiring sections, and the like or that the cover member 47 functions as a reinforcing member of the piezoelectric actuator.

The embodiment and its modified embodiments explained above are merely examples of applying the present teaching to the ink-jet head as a liquid jetting apparatus. However, the piezoelectric actuator of the present teaching is not limited to being used for the purpose of applying pressure to liquid. It may also be used for another purpose as follows. That is, one or more piezoelectric elements are arranged in a base material (in the above embodiment, the vibration plate 30 corresponds to this base material) and the piezoelectric elements are driven by the driver IC to deform the base material, thereby causing various objects to be driven to generate displacement, vibration, and the like.

What is claimed is:

1. A liquid jetting apparatus configured to discharge a liquid, comprising:
    a channel structure in which a liquid channel, including a nozzle and a pressure chamber communicating with the nozzle, is formed;
    a piezoelectric element including:
        a piezoelectric body arranged, on a surface of the channel structure, to face the pressure chamber; and
        an electrode provided on the piezoelectric body;
    a driving device electrically connected to the electrode to drive the piezoelectric element; and
    a cover member joined to the surface of the channel structure so that the cover member is stacked on the surface to cover the piezoelectric element;
    wherein a first wiring section connected to the electrode is formed on the surface of the channel structure;
    wherein the cover member includes:
        a cover body section covering the piezoelectric element; and
        a wiring connection section extending from the cover body section in a direction parallel to the surface of the channel structure while facing at least a part of the first wiring section;
    wherein a second wiring section is formed in the cover member, the second wiring section being connected to the driving device and extending from the cover body section to a surface, of the wiring connection section, facing the first wiring section;
    wherein the wiring connection section is joined to the surface of the channel structure in a state that the second wiring section is electrically conductive with the first wiring section;
    wherein a thickness, of the wiring connection section, in a direction of stacking of the channel structure and the cover member is thinner than a thickness, of the cover body section, in the direction of stacking of the channel structure and the cover member; and
    wherein the cover body section and the wiring connection section comprise electrically insulating material.

2. The liquid jetting apparatus according to claim 1;
    wherein an anisotropic conductive adhesive joining the wiring connection section and the surface of the channel structure is arranged between the wiring connection section and the surface of the channel structure.

3. The liquid jetting apparatus according to claim 1;
    wherein a through hole is formed in the cover body section; and
    wherein the second wiring section includes:
        a first portion which is drawn from the surface, of the wiring connection section, facing the first wiring section through an inner surface of the cover body section; and
        a second portion which is drawn up to an outer surface of the cover body section through the through hole formed in the cover body section.

4. The liquid jetting apparatus according to claim 3;
    wherein the cover body section includes:
        a ceiling portion facing the surface of the channel structure with the piezoelectric element intervening therebetween; and
        a side wall portion which is coupled to the wiring connection section so that the ceiling portion and the surface of the channel structure are connected to each other;
    wherein the through hole is formed in the ceiling portion of the cover body section; and
    wherein the driving device is provided on an outer surface of the ceiling portion of the cover body section.

5. The liquid jetting apparatus according to claim 3;
    wherein the cover body section of the cover member covers the piezoelectric element with a spacing distance intervening therebetween.

6. The liquid jetting apparatus according to claim 1;
    wherein a concave portion is formed in the cover body section; and
    wherein the driving device is provided in the cover body section in a state of being accommodated in the concave portion.

7. The liquid jetting apparatus according to claim 1;
    wherein a plurality of nozzles and a plurality of pressure chambers are formed in the channel structure, the pressure chambers being communicated with the nozzles respectively and aligned in a predetermined direction parallel to the surface of the channel structure;
    wherein a plurality of piezoelectric elements which correspond to the pressure chambers respectively are aligned in the predetermined direction;
    wherein the cover body section of the cover member covering the piezoelectric elements, which belong to one piezoelectric element array, commonly; and
    wherein a plurality of first wiring sections are electrically conductive with a plurality of second wiring sections in the wiring connection section, the first wiring sections being respectively connected to electrodes of the piezoelectric elements covered with the cover body section, and the second wiring sections being formed in the cover body section.

8. The liquid jetting apparatus according to claim 7;
wherein the channel structure includes:
   a liquid supply section which is connected to a liquid supply source; and
   a common liquid chamber extending from the liquid supply section in the predetermined direction to be communicated with the pressure chambers aligned in the predetermined direction;
wherein the cover body section includes:
   a ceiling portion facing the surface of the channel structure with each of the piezoelectric elements intervening therebetween; and
   a side wall portion which us coupled to the wiring connection section so that the ceiling portion and the surface of the channel structure are connected to each other;
wherein the driving device is provided in the ceiling portion of the cover body section; and
wherein the side wall portion of the cover body section includes a high heat-resistance portion which is configured to have a heat resistance higher than that of a periphery.

9. The liquid jetting apparatus according to claim 8;
wherein the heat resistance of the side wall portion of the cover body section is higher at a position further away from the ink supply section in the predetermined direction.

10. The liquid jetting apparatus according to claim 8;
wherein the high-heat resistance portion of the side wall portion has a thickness in the direction of stacking of the channel structure and the cover member which is thinner than that of the periphery.

11. The liquid jetting apparatus according to claim 7;
wherein the channel structure includes:
   a liquid supply section which is connected to a liquid supply source; and
   a common liquid chamber extending from the liquid supply section in the predetermined direction to be communicated with the pressure chambers aligned in the predetermined direction;
wherein the cover body section includes:
   a ceiling portion configured to face the surface of the channel structure with each of the piezoelectric elements intervening therebetween; and
   a side wall portion which is coupled to the wiring connection section so that the ceiling portion and the surface of the channel structure are connected to each other;
wherein the driving device is provided in the ceiling portion of the cover body section; and
wherein the side wall portion of the cover body section includes a low heat-resistance portion having a heat resistance smaller than that of the side wall portion.

12. The liquid jetting apparatus according to claim 7;
wherein the pressure chambers are aligned in two arrays in the predetermined direction and the piezoelectric elements which correspond to the pressure chambers are aligned in two arrays in the predetermined direction;
wherein the first wiring sections are drawn from the electrodes, which respectively correspond to the piezoelectric elements aligned in the two arrays, to inner sides of two piezoelectric element arrays respectively;
wherein the cover member includes two cover body sections covering the two piezoelectric element arrays respectively and the wiring connection section which is arranged to connect the two cover body sections; and
wherein the first wiring sections, which are drawn from the two piezoelectric element arrays, are electrically conductive with the second wiring sections, which are formed in the two cover body sections, in the wiring connection section.

13. The liquid jetting apparatus according to claim 7;
wherein the wiring connection section of the cover member is arranged on one side of the cover body section in a direction perpendicular to the predetermined direction in which the piezoelectric element array is aligned and is not arranged on the other side of the cover body section.

14. A piezoelectric actuator, comprising:
a piezoelectric element including:
   a piezoelectric body which is arranged on a surface of a base material; and
   an electrode which is provided in the piezoelectric body;
a driving device electrically connected to the electrode to drive the piezoelectric element;
a cover member joined to the surface of the base material so that the cover member is stacked on the surface to cover the piezoelectric element;
wherein a first wiring section connected to the electrode is formed on the surface of the base member;
wherein the cover member includes:
   a cover body section covering the piezoelectric element; and
   a wiring connection section extending from the cover body section in a direction parallel to the surface of the base material while facing at least a part of the first wiring section;
wherein a second wiring section is formed in the cover member, the second wiring section being connected to the driving device and extending from the cover body section to a surface, of the wiring connection section, facing the first wiring section;
wherein the wiring connection section is joined to the surface of the base material in a state that the second wiring section is electrically conductive with the first wiring section;
wherein a thickness, of the wiring connection section, in a direction of stacking of the base material and the cover member is thinner than a thickness, of the cover body section, in the direction of stacking of the base material and the cover member; and
wherein the cover body section and the wiring connection section comprise electrically insulating material.

* * * * *